(12) United States Patent
Petrofsky

(10) Patent No.: US 6,516,291 B2
(45) Date of Patent: Feb. 4, 2003

(54) RMS-TO-DC CONVERTER WITH FAULT DETECTION AND RECOVERY

(75) Inventor: Joseph Gerard Petrofsky, Cupertino, CA (US)

(73) Assignee: Linear Technology Corporation, Milpitas, CA (US)

( * ) Notice: Subject to any disclaimer, the term of this patent is extended or adjusted under 35 U.S.C. 154(b) by 197 days.

(21) Appl. No.: 09/736,068

(22) Filed: Dec. 13, 2000

(65) Prior Publication Data

US 2002/0103627 A1 Aug. 1, 2002

(51) Int. Cl.$^7$ .............................................. G06F 15/00

(52) U.S. Cl. ...................... 702/198; 702/189; 702/116; 702/120; 327/63; 327/65; 324/500; 324/522; 324/615

(58) Field of Search .............................. 702/57, 58, 59, 702/64–66, 70, 79, 85, 86, 89, 90, 107, 110, FOR 103, 104, 105, 106, 135, 154; 327/1–5, 7, 9–11, 15–20, 306, 307, 316, 334, 336, 347–349, 358; 324/500, 522, 523, 524, 600–603, 607, 615, 616, 626, 76.11, 76.17, 76.54

(56) References Cited

U.S. PATENT DOCUMENTS

| | | | | |
|---|---|---|---|---|
| 5,150,324 A | | 9/1992 | Takasuka et al. | 364/807 |
| 5,896,056 A | | 4/1999 | Glucina | 327/348 |
| 6,204,719 B1 | * | 3/2001 | Gilbert | 327/349 |
| 6,348,829 B1 | * | 2/2002 | Gilbert | 327/349 |
| 6,362,677 B1 | * | 3/2002 | Petrofksy | 327/348 |

OTHER PUBLICATIONS

Analog Devices, Low cost, Low Power, True RMS–to–DC Converter, AD737 Datasheet, Dec. 1999, pp. 1–8.*
Williams, J., "A Monolithic IC for 100 MHz RMS–DC Conversion" *Linear Technology*, Application Note 22, Sep. 1987.
Kitchin, C., & Counts, L., "RMS to DC Conversion Application Guide—2$^{nd}$ Edition", *Analog Devices*, 1986.
Williams, J., "Thermal Techniques in Measurement and Control Circuitry",*Linear Technology*, Application Note 5, Dec. 1984.
Toumazou, C., et al., ed.s, "Analogue IC Design: The Current–mode Approach" *IEE Circuits and Systems Series 2*, 1990, pp. 39–43, 453–457, & 468–472.
Williams, J., "Thermal–tracking IC Converts RMS to DC", *EDN*, Feb. 19, 1987, pp. 137–151.
Wey, W., & Huang, Y., "A CMOS Delta–Sigma True RMS Converter", *IEEE Journal of Solid–State Circuits*, vol. 35, No. 2, Feb. 2000.
Adams, R.W., et al., "Stability Theory for ΔΣ Modulators" Chapter 4, pp. 141–164, "The Design of High–Order Single–Bit ΔΣ ADCs" Chapter 5, pp. 165–192, *Delta–Sigma Data Converters*, 1997.

* cited by examiner

Primary Examiner—Marc S. Hoff
Assistant Examiner—Elias Desta
(74) *Attorney, Agent, or Firm*—Fish and Neave; Michael E. Shanahan; Jeffrey C. Aldridge

(57) ABSTRACT

A circuit that provides the root-mean-square (RMS) value of an input signal and that detects and independently recovers from an output fault condition is provided. The circuit includes reconfigurable circuitry that changes from normal operating mode to fault recovery mode when an output fault is detected. During fault recovery mode, the circuit provides a modified output signal that allows independent recovery from an output fault condition. Once recovery is complete, the circuit returns to normal operating mode and provides a DC output signal proportional to the RMS value of an AC input signal.

15 Claims, 8 Drawing Sheets

RMS-TO-DC CONVERTER WITH FAULT DETECTION AND RECOVERY

BACKGROUND OF THE INVENTION

The present invention relates to apparatus and methods for providing an output signal proportional to the root-mean-square (RMS) value of an input signal. More particularly, the present invention relates to apparatus and methods for detecting an output fault condition and for recovering from such a condition so that an output signal is provided. The output signal may be a direct current (DC) signal proportional to the RMS value of an input signal (commonly called RMS-to-DC conversion).

The RMS value of a waveform is a measure of the heating potential of that waveform. RMS measurements allow the magnitudes of all types of voltage (or current) waveforms to be compared to one another. Thus, for example, applying an alternating current (AC) waveform having a value of 1 volt RMS across a resistor produces the same amount of heat as applying 1 volt DC voltage across the resistor.

Mathematically, the RMS value of a signal V is defined as:

$$V_{rms} = \sqrt{\overline{V^2}} \qquad (1)$$

which involves squaring the signal V, computing the average value (represented by the overbar in equation (1)), and then determining the square root of the result.

Various previously known conversion techniques have been used to measure RMS values. One previously known conversion system uses oversampling analog-to-digital converters to generate precise digital representations of an applied signal. The digital representations are demodulated and filtered to produce a DC output signal that has the same heat potential as the applied signal. This type of system is attractive to circuit designers because it produces highly accurate results and can be efficiently implemented on an integrated circuit.

FIG. 1 is a generalized schematic representation of a portion of an RMS-to-DC converter circuit. As shown in FIG. 1, RMS-to-DC converter circuit 30 includes pulse modulator 32, demodulator 34, gain stage 36, gain stage 38, and lowpass filter 54. Pulse modulator 32 has a first input coupled to $V_{IN}$, a second input coupled to the output of gain stage 38 and an output $V_1$. Demodulator 34 has an input coupled to $V_{IN}$, a control input coupled to $V_1$, and an output $V_2$. Gain stage 38 has an input coupled to $V_{OUT}$, and provides a broadband gain B. Lowpass filter 54 has an input coupled to $V_2$ and an output $V_3$ coupled to the input of gain stage 36. Gain stage 36 has an output $V_{OUT}$, and provides a broadband gain A.

To simplify the description of pulse modulator 32 and demodulator 34, the following discussion first assumes that A=B=1 (although in practice it is common for A=B>1). As described below, this assumption only affects a scale factor in the resulting analysis. Pulse modulator 32 may be any commonly known pulse modulator, such as a pulse code modulator, pulse width modulator, or other similar modulator. As shown in FIG. 1, pulse modulator 32 is implemented as a single-bit oversampling ΔΣ pulse code modulator, and includes integrator 40, comparator 41, switch 42, non-inverting buffer 44, and inverting buffer 46. As described in more detail below, switch 42 and buffers 44 and 46 form a single-bit multiplying digital-to-analog converter (MDAC) 47.

Integrator 40 has a first input coupled to input $V_{IN}$, a second input coupled to the pole of switch 42, and an output coupled to an input of comparator 41. Comparator 41 has a clock input coupled to clock signal CLK, and an output $V_1$ coupled to control terminals of switches 42 and 52. Clock CLK is a fixed period clock that has a frequency that is much higher than the frequency of input $V_{IN}$ (e.g., 100 times greater). Comparator 41 compares the signal at the output of integrator 40 to a reference level (e.g., GROUND), and latches the comparison result as output signal $V_1$ on an edge of clock CLK.

Non-inverting buffer 44 provides unity gain (i.e., +1.0) and has an input coupled to the output of gain stage 38, and an output coupled to the first terminal of switch 42. Inverting buffer 46 provides inverting gain (i.e., −1.0) and has an input coupled to the output of gain stage 38, and an output coupled to the second terminal of switch 42.

$V_1$ is a signal having a binary output level (e.g., −1 or +1). If $V_1$=+1, the pole of switch 42 is coupled to the output of non-inverting buffer 44. That is, (assuming gain B=1)+$V_{OUT}$ is coupled to the second input of integrator 40. Alternatively, if $V_1$=−1, the pole of switch 42 is coupled to the output of inverting buffer 46. That is, (assuming gain B=1) −$V_{OUT}$ is coupled to the second input of integrator 40. This switching configuration provides negative feedback in pulse modulator 32.

The first and second inputs of integrator 40 therefore can have values equal to:

$$-V_{OUT} \leq V_{IN} \leq +V_{OUT} \qquad (2)$$

and $V_{IN}$ thus has a bipolar input signal range.

From equation (2), if $V_1$ has a duty ratio D between 0–100%, D can be expressed as:

$$D = \frac{1}{2} \times \left( \frac{V_{IN}}{V_{OUT}} + 1 \right), 0 \leq D \leq 1 \qquad (3)$$

That is, if $V_{IN}$=−$V_{OUT}$, D=0, and if $V_{IN}$=+$V_{OUT}$, D=1.

Demodulator 34 includes non-inverting buffer 48, inverting buffer 50 and switch 52, which form a single-bit MDAC. Non-inverting buffer 48 has an input coupled to $V_{IN}$, and an output coupled to a first terminal of switch 52. Inverting buffer 50 has an input coupled to $V_{IN}$, and an output coupled to a second terminal of switch 52. Switch 52 has a control terminal coupled to $V_1$ and a pole coupled to the input of lowpass filter 54.

If $V_1$=+1, the pole of switch 52 is coupled to the output of non-inverting buffer 48. That is, +$V_{IN}$ is coupled to the input of lowpass filter 54. Alternatively, if $V_1$=−1, the pole of switch 52 is coupled to the output of inverting buffer 50. That is, −$V_{IN}$ is coupled to the input of lowpass filter 54.

Demodulator 34 provides an output signal $V_2$ at the pole of switch 52 that may be expressed as:

$$V_2 = +V_{IN} \times D - (-V_{IN}) \times (D - 1) \qquad (4a)$$

$$= V_{IN} \times (2 \times D - 1) \qquad (4b)$$

Substituting equation (3) into equation (4b), $V_2$ is given by:

$$V_2 = \frac{V_{IN}^2}{V_{OUT}} \qquad (5)$$

Lowpass filter 54 may be a continuous-time or a discrete-time filter, and provides an output $V_3$ equal to the time average of input $V_2$. Accordingly, $V_3$ equals:

$$V_3 = \frac{\overline{V_{IN}^2}}{V_{OUT}} \tag{6}$$

Gain stage 36 provides an output $V_{OUT}$ equal to (assuming gain A=1) $V_3$:

$$V_{OUT} = \frac{\overline{V_{IN}^2}}{V_{OUT}} \tag{7a}$$

$$= \sqrt{\overline{V_{IN}^2}} = V_{RMS} \tag{7b}$$

Thus, circuit 30 has a bipolar input range and provides an output $V_{OUT}$ equal to the RMS value of input $V_{IN}$.

Demodulator 34 and stage 47 each are single-bit MDACs and comparator 41 is a single-bit analog-to-digital converter (ADC) that provides a single-bit output $V_1$. The difference between the output of integrator 40 and MDAC 47 equals the quantization error e[i] of pulse modulator 32.

Because the output of comparator 41 controls the polarity of the feedback signal from $V_{OUT}$ to the input integrator 40, converter 30 will remain stable for only one polarity of $V_{OUT}$. If $V_{OUT}$ has a polarity opposite of that assumed for the connection of switch 42 (e.g., during power up, a brown out, or a load fault), modulator 32 will become unstable, and the output of integrator 40 will quickly approach a rail voltage.

With a DC input, this may not be problematic, because the state of $V_1$ might be such that $V_{IN}$ propagates through MDAC 34 and results in the $V_2$ polarity desired for $V_{OUT}$. In this case, once any external influences on $V_{OUT}$ are removed, $V_2$ (and therefore $V_{OUT}$), will return to the proper polarity once it propagates through low pass filter 54. This sequence, however, has a probability of occurring only about 50% of the time, meaning that converter 30 is unlikely to recover in almost half of the possible DC operating cases. Moreover, RMS-to-DC converters are most often used with AC signals, and in those instances output recovery is even less likely to occur.

Thus, in view of the foregoing, it would be desirable to provide methods and apparatus for performing RMS-to-DC conversions that have improved recovery characteristics.

SUMMARY OF THE INVENTION

Accordingly, it is an object of this invention to provide methods and apparatus for performing RMS-to-DC conversions that have fault detection and recovery capabilities.

In accordance with this and other objects of the present invention, circuitry and methods that supply the root-mean-square (RMS) value of an input signal and that detect and independently recover from output fault conditions are provided. The circuit of the present invention includes reconfigurable circuitry that changes from normal operating mode to fault recovery mode when an output fault is detected. During fault recovery mode, the circuit of the present invention generates a modified output signal that allows independent recovery from an output fault condition. Once recovery is complete, the circuit returns to the RMS mode of operation.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

Figure 2A:
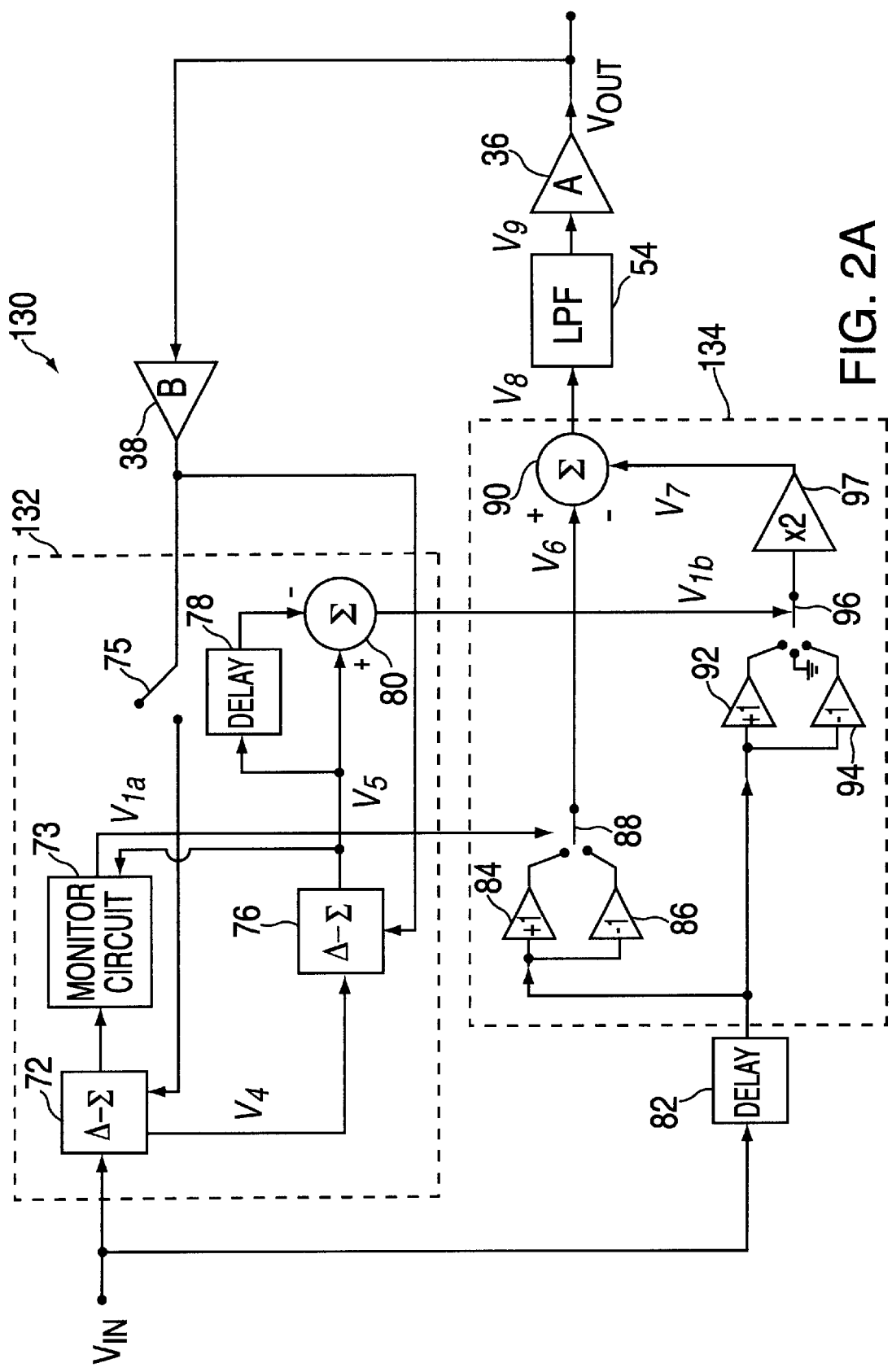
FIG. 2A is a schematic diagram of an RMS-to-DC converter circuit of the present invention.

FIG. 2A illustrates an embodiment of RMS-to-DC converter constructed in accordance with the principles of the present invention. Circuit 130 includes pulse modulator 132, demodulator 134, gain stages 36 and 38, lowpass filter 54, and optional delay-matching stage 82. To simplify the description of modulator 132 and demodulator 134, the following discussion assumes that A=B=1 (although in practice it is common for A=B>1). This assumption only affects a scale factor in the resulting analysis.

Pulse modulator 132 includes cascaded $\Delta\Sigma$ pulse code modulators. In particular, pulse modulator 132 includes reconfigurable $\Delta\Sigma$ stage 72, $\Delta\Sigma$ stage 76, monitor circuit 73, delay stage 78, and subtractor 80. As described in more detail below, $\Delta\Sigma$ stage 76, delay stage 78, and subtractor 80 provide an estimate of the spectrally-shaped quantization error of reconfigurable $\Delta\Sigma$ stage 72.

Reconfigurable $\Delta\Sigma$ stage 72 has a first input coupled to $V_{IN}$, a second input coupled to the output of gain stage 38 (through switch 75), a first output coupled to the input of monitor circuit 73, and a second output $V_4$ coupled to a first input of $\Delta\Sigma$ stage 76. $\Delta\Sigma$ stage 76 has a second input coupled to the output of gain stage 38, and an output $V_5$ coupled to a non-inverting input of subtractor 80 and to an input of delay stage 78. Subtractor 80 has an inverting input coupled to an output of delay stage 78, and an output $V_{1b}$ coupled to a control terminal of switch 96. Monitor circuit 73 may include a delay stage (not shown) to match the delay through $\Delta\Sigma$ stage 76, and has an output $V_{1a}$ coupled to a control terminal of switch 88.

$\Delta\Sigma$ stages 72 and 76 may be, for example, single-bit modulators that can be of any order. Preferably, reconfigurable $\Delta\Sigma$ stage 72 is a first-order stage. Reconfigurable first-order $\Delta\Sigma$ stage 72 and monitor circuit 73 provide output $V_{1a}$ equal to (assuming gain B=1):

$$V_{1a}[i+1] = \frac{(V_{IN}[i-1])}{V_{OUT}} + \frac{(e[i] - e[i-1])}{V_{OUT}} \tag{8}$$

where index i denotes the sample index and e[i] is the quantization error of reconfigurable $\Delta\Sigma$ stage 72. $V_{1a}$ thus equals the desired ratio of the input divided by $V_{OUT}$, plus the spectrally-shaped quantization error of reconfigurable $\Delta\Sigma$ stage 72 divided by $V_{OUT}$.

ΔΣ stage 76, delay stage 78 and subtractor 80 provide an output $V_{1b}$ equal to an estimate of the spectrally-shaped quantization error of reconfigurable ΔΣ stage 72 divided by $V_{OUT}$. In particular, $V_4$ is the quantization error e[i] of reconfigurable ΔΣ stage 72, which is a function of the input signal $V_{IN}$, the state of the integrator, and the local feedback within the MDAC of reconfigurable ΔΣ stage 72. ΔΣ stage 76 provides an output $V_5$ equal to (assuming gain B=1)

$$V_5[i+1] = \left(\frac{1}{V_{OUT}}\right) \times [e[i] + (e'[i+1] - e'[i])] \quad (9)$$

where e'[i] is the quantization error of ΔΣ stage 76. Delay stage 78 and subtractor 80 form a digital differentiator that provide an output $V_{1b}$ equal to (assuming B=1):

$$V_{1b}[i+1] = \left(\frac{1}{V_{OUT}}\right) \times [e_1 + e_2] \quad (10)$$

where $$e_1 e[i] - e[i-1] \quad (11a)$$

$$e_2 e = e'[i+1] - 2e'[i] + e'[i-1] \quad (11b)$$

Delay stage 82 matches the combined delay through pulse code modulator 132. Demodulator 134 provides an output proportional to input $V_{IN}$ times the ratio of $V_{IN}$ to $V_{OUT}$. In particular, demodulator 134 includes non-inverting buffer 84, inverting buffer 86, switch 88, subtractor 90, non-inverting buffer 92, inverting buffer 94, three-position switch 96 and multiply-by-two stage 97. Non-inverting buffer 84 provides unity gain (i.e., +1.0) and has an input coupled through delay stage 82 to input $V_{IN}$, and an output coupled to the first terminal of switch 88. Inverting buffer 86 provides inverting gain (i.e., −1.0) and has an input coupled through delay stage 82 to input $V_{IN}$, and an output coupled to the second terminal of switch 88. Non-inverting buffer 84, inverting buffer 86 and switch 88 form a single-bit MDAC.

$V_{1a}$ is a binary signal having a binary output level (e.g., −1 or +1). If $V_{1a}$=+1, the pole of switch 88 is coupled to the output of non-inverting buffer 84. That is, +$V_{IN}$ is coupled to first input $V_6$ of subtractor 90. Alternatively, if $V_{1a}$=−1, the pole of switch 88 is coupled to the output of inverting buffer 86. That is, −$V_{IN}$ is coupled to first input $V_6$ of subtractor 90. $V_6$ equals (assuming gain B=1).

$$V_6[i+1] = \frac{V_{IN}[i-1]}{V_{OUT}} \times V_{1a}[i+1] \quad (12a)$$

$$= \frac{V_{IN}[i-1]}{V_{OUT}} \times (V_{IN}[i-1] + e_1) \quad (12b)$$

Non-inverting buffer 92 provides unity gain (i.e., +1.0) and has an input coupled through delay stage 82 to input $V_{IN}$, and an output coupled to the first terminal of three-position switch 96. Inverting buffer 86 provides inverting gain (i.e., −1.0) and has an input coupled through delay stage 82 to input $V_{IN}$, and an output coupled to the third terminal of three-position switch 96. The second terminal of three-position switch 96 is coupled to GROUND. Non-inverting buffer 92, inverting buffer 94 and three-position switch 96 form a 1.5-bit MDAC. Multiply-by-two stage 97 provides a gain of +2.0.

$V_{1b}$ is a tri-level signal having output values of −2, 0 or +2. If $V_{1b}$=+2, the pole of three-position switch 96 is coupled to the output of non-inverting buffer 92. That is, +2$V_{IN}$ is coupled to second input $V_7$ of subtractor 90. If $V_{1b}$=0, the pole of switch 96 is coupled to GROUND, and therefore 0 is coupled to second input $V_7$ of subtractor 90. If, however, $V_{1b}$=−2, the pole of switch 96 is coupled to the output of inverting buffer 94. That is, −2$V_{IN}$ is coupled to second input $V_7$ of subtractor 90. $V_7$ equals (assuming gain B=1):

$$V_7[i+1] = \frac{V_{IN}[i-1]}{V_{OUT}} \times (e_1 + e_2) \quad (13)$$

Subtractor 90 provides an output $V_8$ that equals the difference between $V_6$ and $V_7$:

$$V_8[i+1] = V_6[i+1] - V_7[i+1] \quad (14a)$$

$$= \frac{V_{IN}[i-1]^2}{V_{OUT}} - \frac{V_{IN}[i-1]}{V_{OUT}} \times e_2 \quad (14b)$$

Thus, $V_8$ is proportional to $V_{IN}$ squared divided by $V_{OUT}$, substantially without the quantization noise of reconfigurable ΔΣ stage 72. The quantization noise $e_2$ of ΔΣ stage 76 remains, but the low frequency portion of that noise is further reduced by the spectral shaping provided by delay 78 and subtractor 80. Further, because $e_2$ is uncorrelated with $V_{IN}$, the DC average of the product of $e_2$ and $V_{IN}$ equals zero. As a result, output $V_9$ of lowpass filter 54 approximately equals:

$$V_9 \approx \sqrt{V_{IN}^2} \quad (15)$$

Output $V_{OUT}$ of gain stage 36 approximately equals (assuming gain A=1):

$$V_{OUT} \approx \sqrt{V_{IN}^2} \quad (16)$$

The circuit of FIG. 2A may be implemented using single-ended or differential circuitry.

During operation, output signals from reconfigurable ΔΣ stage 72 may pass through monitor circuit 73 to the pole of switch 88. As mentioned above, when $V_{OUT}$ changes polarity, ΔΣ stages 72 and 76 become unstable, producing a string of output bits with the same logic level. Monitor circuit 73, which may include counter circuits and/or latch circuitry (not shown), detects this string and interprets it as a "fault condition." In response to the detected fault condition, monitor circuit 73 generates a control signal that causes circuit 130 to switch from RMS-to-DC conversion mode to fault recovery mode.

The number of consecutive same logic level bits that constitute a fault condition may be varied if desired. For example, with certain modulator topologies, the number of bits may be set to be relatively long (e.g., about 50) to ensure circuit 130 does not enter recovery mode inadvertently. In other applications, however, the number of bits may be somewhat less (e.g., about 15) to reduce recovery time.

In fault recovery mode, switch 75 is opened, breaking the feedback path from output $V_{OUT}$ to ΔΣ stage 72. In addition, some components within ΔΣ stage 72 are reconfigured so that ΔΣ stage 72 functions as a comparator circuit rather than as a modulator circuit (shown as comparator circuit 77 in FIG. 2B).

Figure 2B:
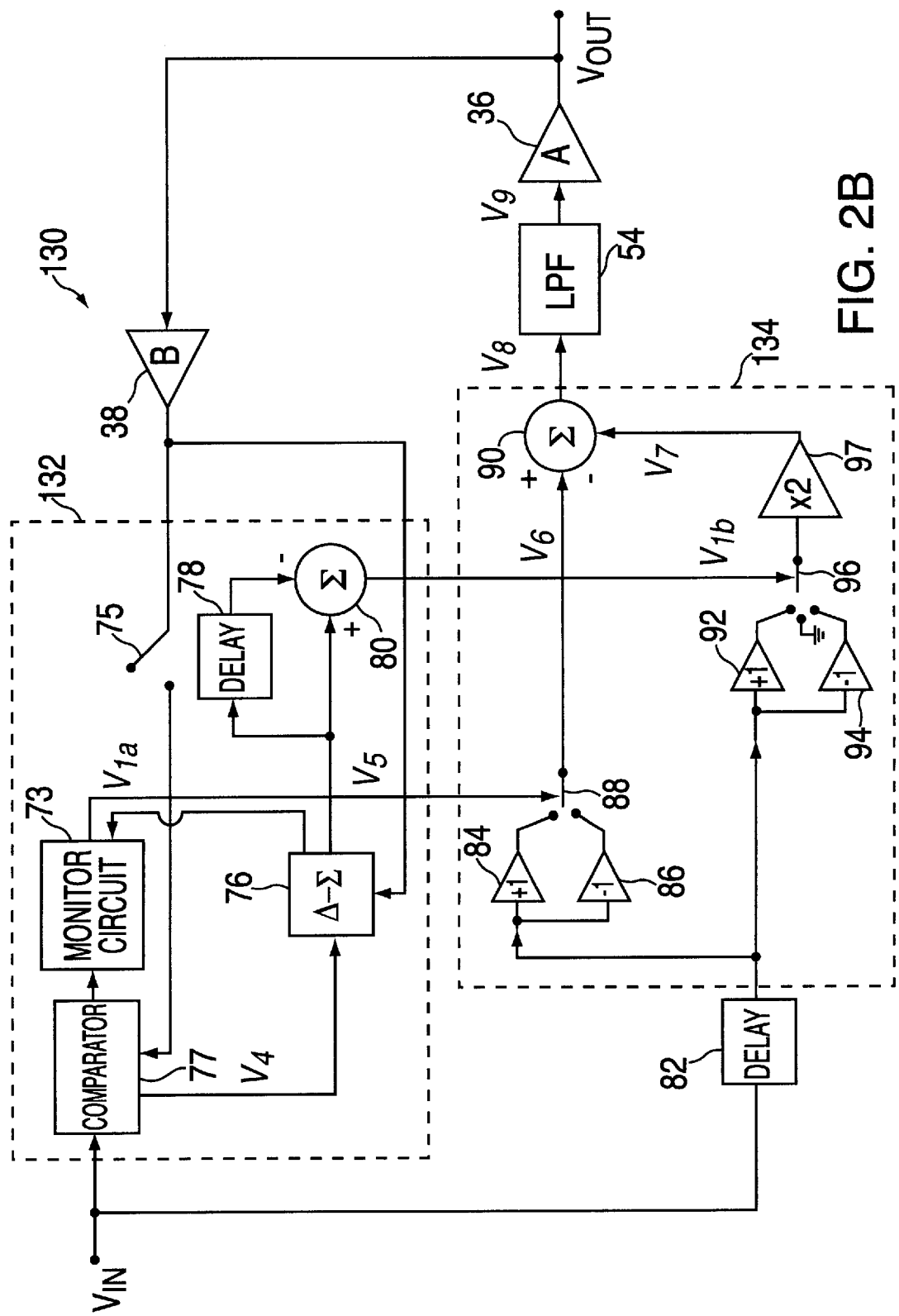
FIG. 2B is another schematic diagram of an RMS-to-DC converter circuit of the present invention.

With this arrangement, shown in FIG. 2B, circuit 130 operates as a mean-absolute-detect circuit instead of an RMS-to-DC converter. Circuit 130 thus determines the average of the absolute value of input signal $V_{IN}$. Although this measurement is less meaningful than the RMS value of the input signal, it ensures circuit 130 will produce an output signal $V_{OUT}$ that has the proper polarity. Once $V_{OUT}$ returns to the correct polarity, the bit stream produced by ΔΣ stage 76 toggles, indicating that the fault condition has cleared. Monitor circuit 73 detects this change of logic level and returns circuit 130 to RMS-to-DC conversion mode (i.e., closes switch 75 and reconfigures comparator 77 to operate as ΔΣ stage 72). In this way, circuit 130 may detect and recover from fault conditions irrespective of the type and amplitude of input signal $V_{IN}$.

As shown in FIG. 2B, to operate as a mean-absolute-detect circuit, the feedback from $V_{OUT}$ to comparator 77 is disconnected. The output signal produced by comparator 77 is a bit stream that represents the polarity of input signal $V_{IN}$. Comparator 77 may be configured as a polarity detector using any suitable arrangement known in the art (e.g., by connecting a threshold terminal to ground and a sensing terminal (both not shown) to input signal $V_{IN}$).

When the output of comparator 77 is provided to demodulator 134 (i.e., the pole of switch 88), the input signal $V_{IN}$ is multiplied by its own polarity, thus performing an absolute value operation. The resulting signal is then fed through lowpass filter 54 which provides an output signal $V_{OUT}$ of the desired polarity (assuming any external stimuli has been removed from the output node).

As long as output signal $V_{OUT}$ is the incorrect polarity, ΔΣ stage 76 will be unstable, and its output will remain at either a logic low or a logic high (depending on its state when the output fault occurred). When this occurs, subtractor 80 has a substantially zero output and will not affect the value of $V_{OUT}$.

When circuit 130 is operating in mean-absolute-detect mode, error signal $V_4$ produced by comparator 77 is the input signal $V_{IN}$ (or a scaled version thereof). Thus, the output of ΔΣ stage 76 can be monitored (by monitor circuit 73) to determine when recovery from an output fault has occurred. For example, when the bit stream produced by ΔΣ stage 76 toggles from one logic state to another, circuit 130 has recovered from the fault condition and may be reconfigured back to the RMS-to-DC converter shown in FIG. 2A.

The overall gain of circuit 130 during fault recovery (i.e., mean-absolute-detect mode) does not need to be similar to that of the RMS-to-DC mode (i.e., normal operation). However, increased gain during fault recovery does tend to reduce recovery time. Moreover, it will be understood that with certain input waveforms and filter time constants, circuit 130 may go into fault recovery, back to normal operation, and return to fault recovery several times in succession. As long as the output is free of external influences however, circuit 130 will recover. The successive fault mode periods will become shorter in duration until circuit 130 has fully recovered.

Figure 1:
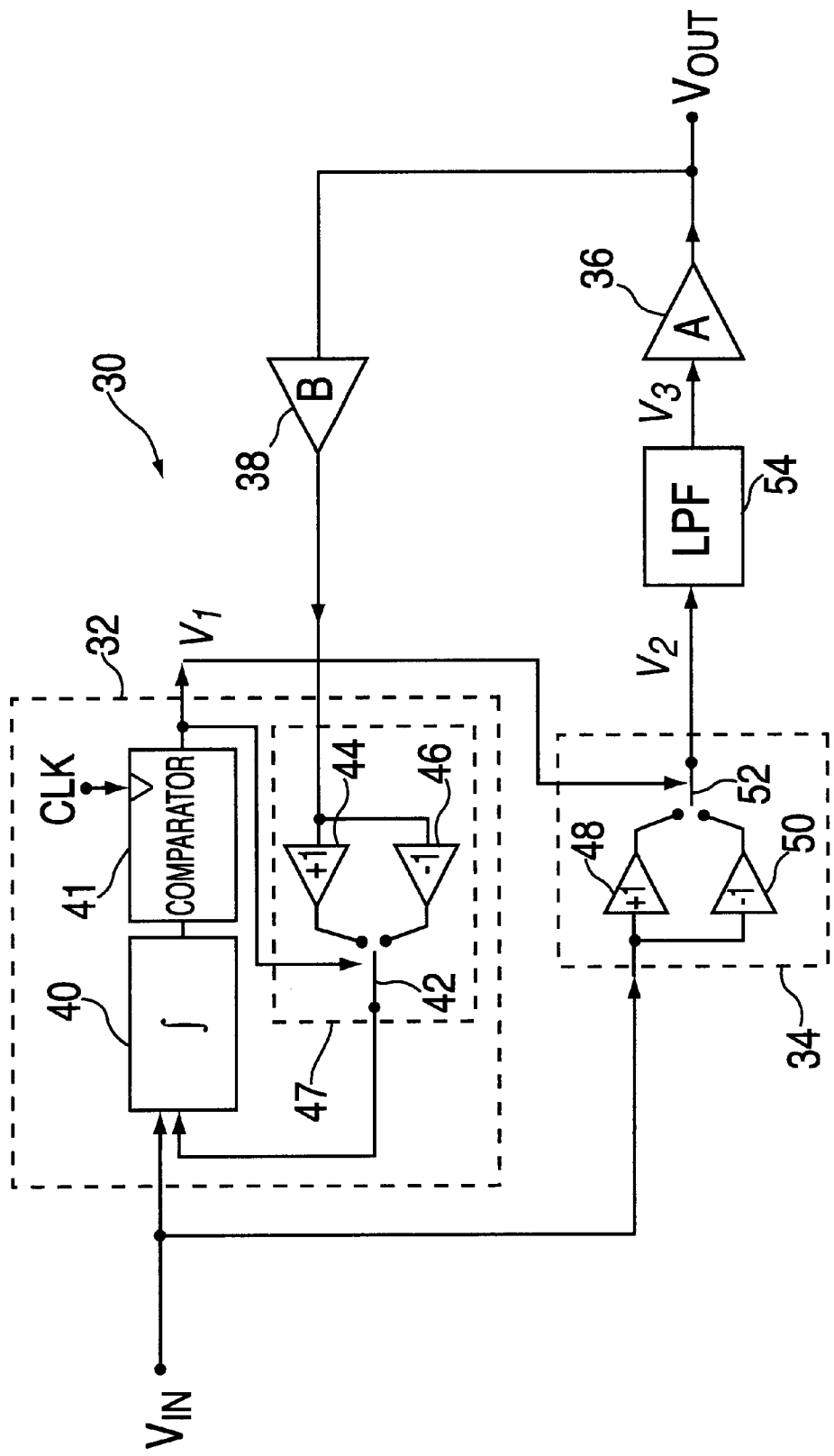
FIG. 1 is a schematic diagram of a previously known RMS-to-DC converter circuit.
Figure 3A:
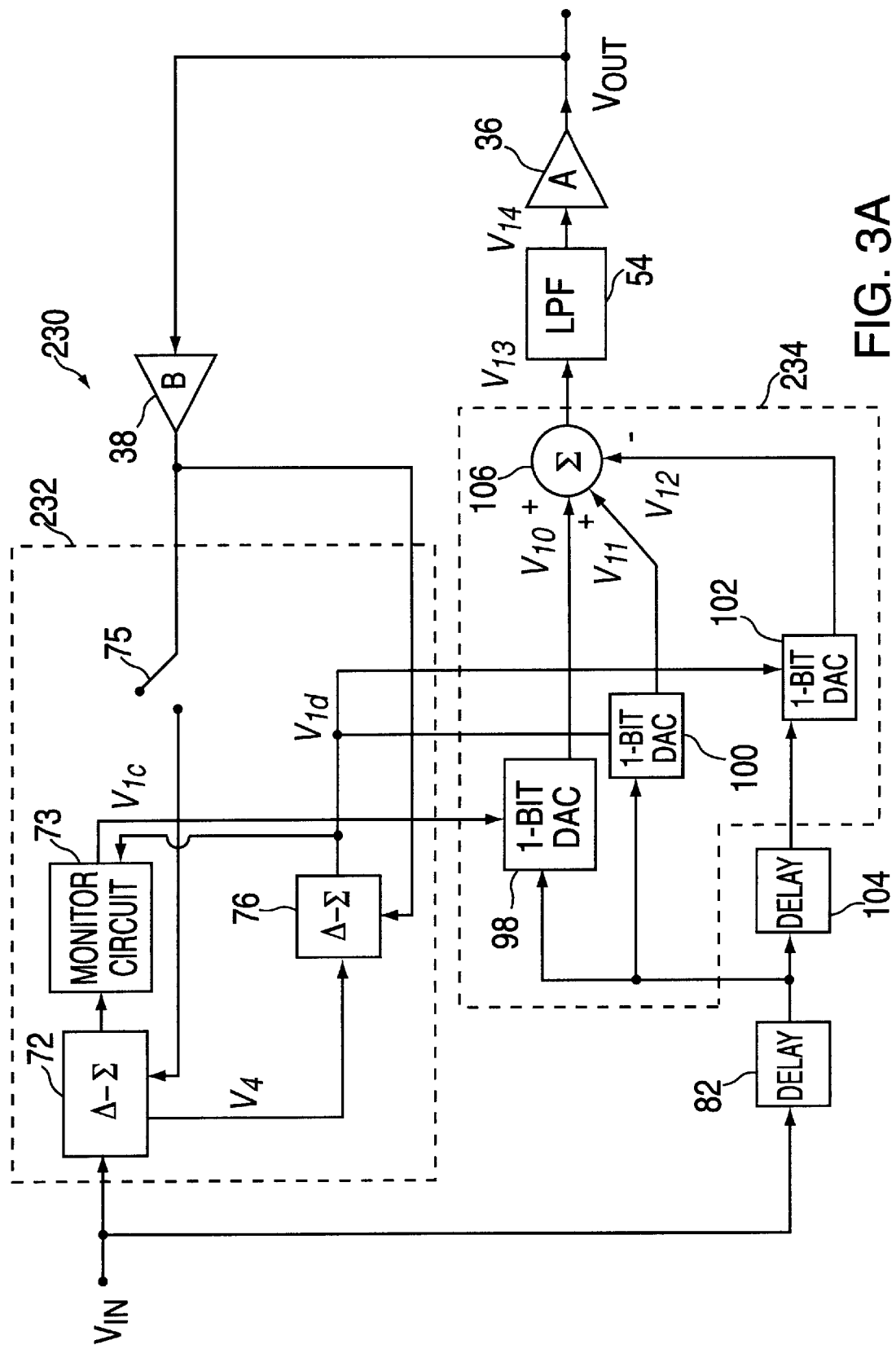
FIG. 3A is another schematic diagram of an RMS-to-DC converter circuit of the present invention.

FIG. 3A shows another illustrative embodiment of RMS-to-DC converter constructed in accordance with the present invention. Converter 230 includes single-sample delay stages 82 and 104, modulator 232 and demodulator 234. Modulator 232 includes single-bit reconfigurable ΔΣ stage 72, ΔΣ stage 76, and monitor circuit 73, and demodulator 234 includes single-bit MDAC stages 98, 100 and 102, and adder/subtractor 106. MDACS 98, 100, and 102 may be implemented as in demodulator 34 of FIG. 1. Alternatively, some of MDACS 98, 100 and 102 may be implemented as a single time-multiplexed MDAC.

Reconfigurable ΔΣ stage 72 provides a quantized output $V_{1c}$ equal to (assuming gain B=1):

$$V_{1c}[i] = \frac{V_{IN}[i-1] + e[i] - e[i-1]}{V_{OUT}} \quad (17)$$

In addition, $V_4$ equals the quantization error e[i] of reconfigurable ΔΣ stage 72.

ΔΣ stage 76 provides a quantized output $V_{1d}$ equal to (assuming gain B=1):

$$V_{1d}[i] = \frac{e[i-1] + e'[i] - e'[i-1]}{V_{OUT}} \quad (18)$$

Single-bit DACs 98, 100 and 102 provide outputs $V_{10}$, $V_{11}$ and $V_{12}$, respectively, equal to (assuming gain B=1):

$$V_{10}[i] = V_{IN}[i-1]V_{1d}[i] \quad (19)$$

$$V_{11}[i] = V_{IN}[i-1]V_{1d}[i] \quad (20)$$

$$V_{12}[i] = V_{IN}[i-2]V_{1d}[i] \quad (21)$$

Adder/subtractor 106 provides an output $V_{13}$ equal to:

$$V_{13}[i] = V_{10}[i] + V_{11}[i] - V_{12}[i] \quad (22)$$

which equals (assuming gain B=1):

$$V_{13}[i] = \frac{V_{IN}[i-1]}{V_{OUT}} \times (V_{IN}[i-1] + e[i] + e'[i] - e'[i-1]) - \frac{V_{IN}[i-2]}{V_{OUT}} \times (e[i-1] + e'[i] - e'[i-1]) \quad (23)$$

Note that:

$$V_{13}[i+1] = \frac{V_{IN}[i]}{V_{OUT}} \times (V_{IN}[i] + e[i+1] + e'[i+1] - e'[i]) - \frac{V_{IN}[i-1]}{V_{OUT}} \times (e[i] + e'[i+1] - e'[i]) \quad (24)$$

If the time constant of lowpass filter 54 is much greater than the sample period of $V_{13}$[i] (e.g., 10,000 times), lowpass filter 54 provides output $V_{14}$ that is the average of sequence $V_{13}$. $V_{13}$ as a function of $V_{IN}$[i-1] approximately equals:

$$V_{13}|V_{IN}[i-1] \approx \frac{V_{IN}[i-1]}{V_{OUT}} \times (V_{IN}[i-1] + e[i] + e'[i] - e'[i-1]) - \frac{V_{IN}[i-1]}{V_{OUT}} \times (e[i] + e'[i+1] - e'[i]) \quad (25)$$

which may be written as:

$$V_{13}|V_{IN}[i-1] = \quad (26)$$
$$\left(\frac{V_{IN}[i-1]}{V_{OUT}}\right)^2 - \frac{V_{IN}[i-1] \times (e'[i+1] - 2e'[i] + e'[i-1])}{V_{OUT}}$$

The first term on the right side of equation (26) is the desired output, and the second term equals the second-order spectrally-shaped quantization noise of ΔΣ stage 76, which is substantially reduced by lowpass filter 54. Further, because e' is uncorrelated with $V_{IN}$, the DC average of the product of e' and $V_{IN}$ equals zero. As a result, $V_{14}$ approximately equals:

$$V_{14} = \overline{V_{13}} \approx \frac{\overline{V_{IN}^2}}{V_{OUT}} \quad (27)$$

Output $V_{OUT}$ of gain stage 36 approximately equals (assuming gain A=1):

$$V_{OUT} \approx \sqrt{\overline{V_{IN}^2}} \quad (28)$$

The circuit of FIG. 3A may be implemented using single-ended or differential circuitry.

During operation, output signals from reconfigurable $\Delta\Sigma$ stage 72 may pass through monitor circuit 73 to MDAC 98. As mentioned above, when $V_{OUT}$ changes polarity, $\Delta\Sigma$ stages 72 and 76 become unstable, producing a string of output signals with a constant logic level. Monitor circuit 73 detects this output string, which it interprets as a "fault condition" and generates a control signal that causes circuit 230 to switch from RMS-to-DC conversion mode to fault recovery mode.

In fault recovery mode, switch 75 is opened, breaking the feedback path from output $V_{OUT}$ to $\Delta\Sigma$ stage 72. Additionally, some components within $\Delta\Sigma$ stage 72 are reconfigured so that $\Delta\Sigma$ stage 72 functions as a comparator circuit rather than as a modulator circuit (shown as comparator circuit 77 in FIG. 3B).

Figure 3B:
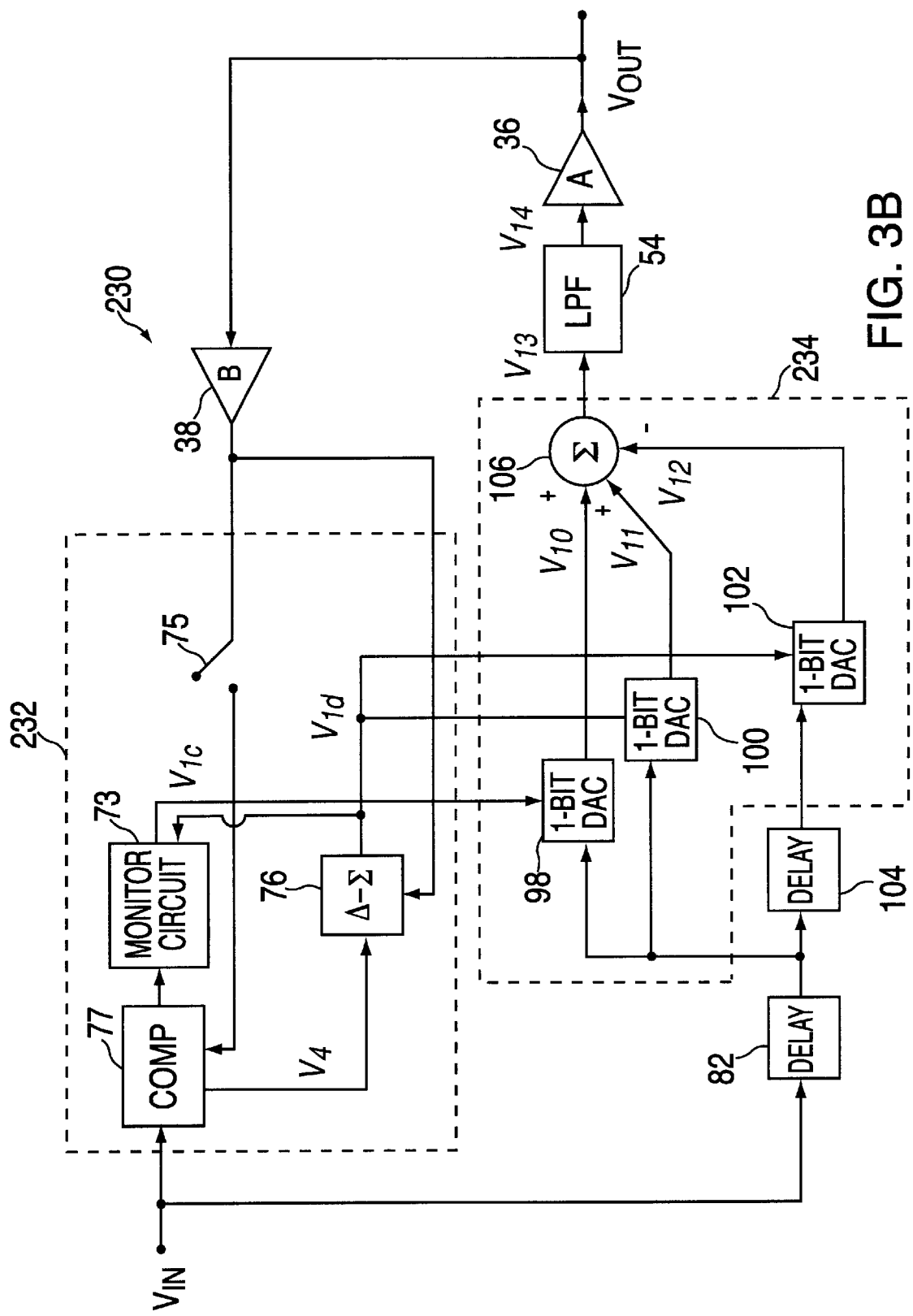
FIG. 3B is another schematic diagram of an RMS-to-DC converter circuit of the present invention.

In this arrangement, shown in FIG. 3B, circuit 230 operates as a mean-absolute-detect circuit instead of an RMS-to-DC converter. Circuit 230 thus determines the average of the absolute value of the input signal. Although this measurement is less meaningful than the RMS value of the input signal, it ensures circuit 230 will produce an output signal $V_{OUT}$ that has the proper polarity. Once $V_{OUT}$ returns to the proper polarity, the bit stream produced by comparator 77 toggles, indicating that the fault condition has cleared. Monitor circuit 73 detects this change of logic level and returns circuit 230 back to RMS-to-DC conversion mode (i.e., closes switch 75 and reconfigures comparator 77 to operate as $\Delta\Sigma$ stage 72). In this way, circuit 230 may detect and recover from fault conditions irrespective of the type and amplitude of input signal $V_{IN}$.

As shown in FIG. 3B, to operate as a mean-absolute-detect circuit, the feedback from $V_{OUT}$ to comparator 77 is disconnected. The output signal produced by comparator 77 is a bit stream that represents the polarity of input signal $V_{IN}$. Comparator 77 may be configured as a polarity detector using any suitable method known in the art (e.g., by connecting a threshold terminal to ground and a sensing terminal (both not shown) to input signal $V_{IN}$).

When the output of comparator 77 is provided to demodulator 234 (i.e., MDAC 98), input signal $V_{IN}$ is multiplied by its own polarity, thus performing an absolute value operation. The resulting signal is fed through lowpass filter 54 which generates an output signal ($V_{OUT}$) of the desired polarity (assuming any external stimuli has been removed from the output node).

As long as output signal $V_{OUT}$ is the incorrect polarity, $\Delta\Sigma$ stage 76 will remain unstable. Its output will therefore remain at either a logic low or a logic high (depending on its state when the output fault occurred). When this occurs, $V_{11}$ and $V_{12}$ substantially cancel each other out (at summing node 106), and thus output $V_{13}$ is substantially equal to the value of $V_{10}$. Alternatively, $V_{11}$ and $V_{12}$ may be disconnected from summer 106 during fault recovery.

When circuit 230 is operating as a mean-absolute-detector, error signal $V_4$ produced by comparator 77 is the input signal $V_{IN}$ (or a scaled version thereof). Thus, the output of $\Delta\Sigma$ stage 76 can be monitored (by monitor circuit 73) to determine when recovery from an output fault has occurred. For example, when the bit stream produced by $\Delta\Sigma$ stage 76 toggles from one logic state to another, indicating a change in output polarity, circuit 230 has recovered from the fault condition and may be reconfigured back to the RMS-to-DC converter shown in FIG. 3A.

The overall gain of circuit 230 during fault recovery (i.e., mean-absolute-detect mode) does not need to be similar to that of the RMS-to-DC mode (normal operation). However, increased gain during fault recovery does tend to reduce recovery time. Moreover, it will be understood that with certain input waveforms and filter time constants, circuit 230 may go into fault recovery, back to normal operation, and back to fault recovery several times in succession. As long as the output is free of external influences however, circuit 230 will recover. The successive fault mode periods will become shorter in duration until circuit 230 has fully recovered.

Figure 4A:
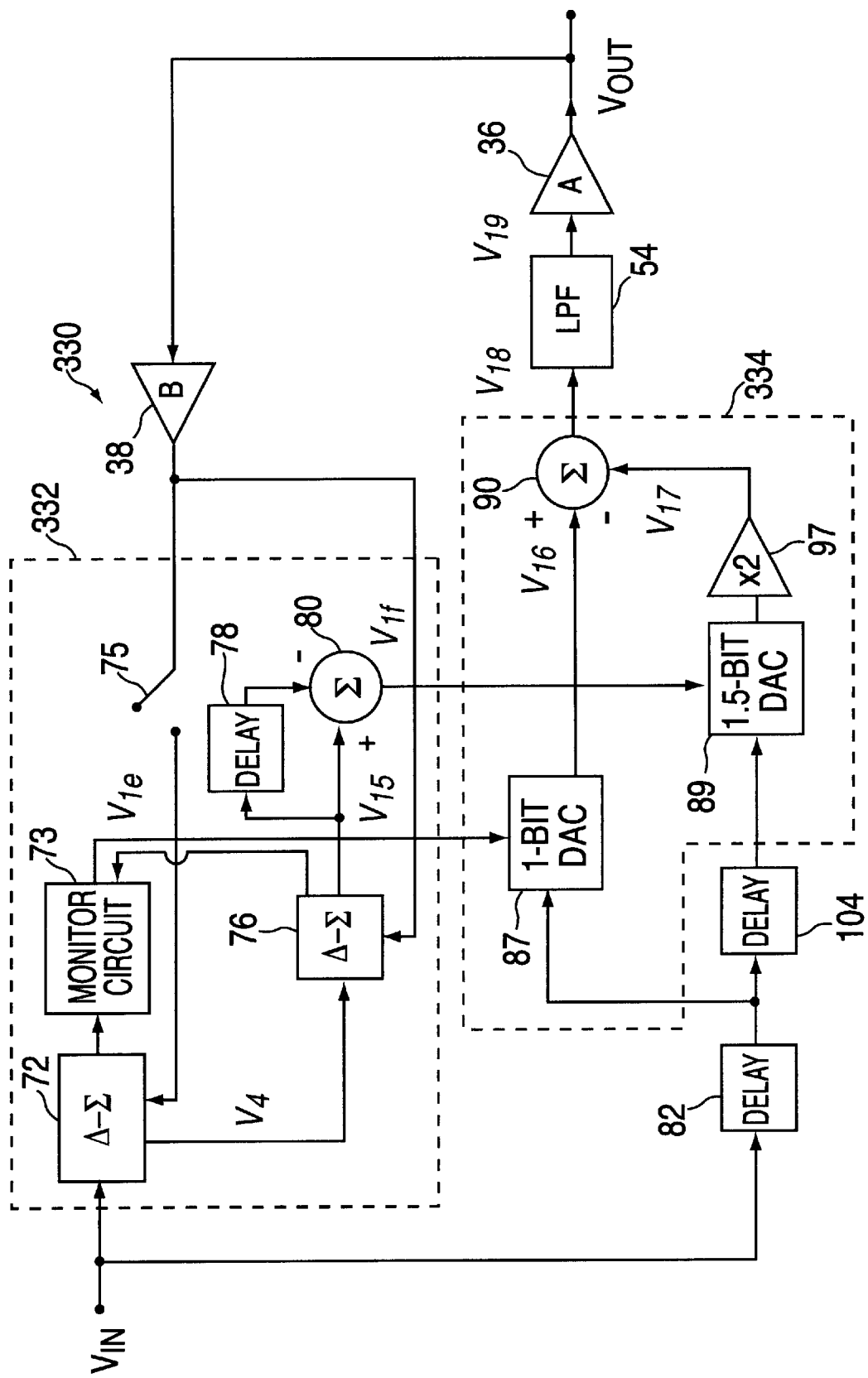
FIG. 4A is another schematic diagram of an RMS-to-DC converter circuit of the present invention.

FIG. 4A illustrates another embodiment of RMS-to-DC converters constructed in accordance with the principles of the present invention. Circuit 330 includes delay stages 82 and 104 and pulse modulator 332 and demodulator 334. Circuit 330 includes features of circuits 130 and 230, but substantially eliminates the effect of any DC offset that may occur in $\Delta\Sigma$ stage 76 and delay stage 104.

Modulator 332 includes single-bit reconfigurable $\Delta\Sigma$ stage 72 and $\Delta\Sigma$ stage 76, delay stage 78, and subtractor 80. Demodulator 334 includes 1-bit DAC 87, 1.5-bit DAC 89 (which may be constructed similar to the DAC formed by buffers 92 and 94 and switch 96), subtractor 90, and multiply-by-two stage 97. Delay stage 82 matches the delay through reconfigurable $\Delta\Sigma$ modulator 72 and delay stage 104 matches the delay through $\Delta\Sigma$ modulator 76.

Reconfigurable $\Delta\Sigma$ stage 72 provides a quantized output $V_{1e}$ equal to (assuming gain B=1):

$$V_{1e}[i] = \frac{V_{IN}[i-1] + e[i] - e[i-1]}{V_{OUT}} \quad (29)$$

$\Delta\Sigma$ stage 76, delay stage 78 and subtractor 80 provide an output $V_{1f}$ equal to an estimate of the spectrally-shaped quantization error $V_4$ of reconfigurable AS stage 72 divided by $V_{OUT}$. $\Delta\Sigma$ stage 76 provides an output $V_{15}$ equal to (assuming gain B=1):

$$V_{15}[i+1] = \left(\frac{1}{V_{OUT}}\right) \times [e[i] + (e'[i+1] - e'[i])] \quad (30)$$

where e'[i] is the quantization error of $\Delta\Sigma$ stage 76. Delay stage 78 and subtractor 80 form a digital differentiator that provide an output $V_{1f}$ equal to (assuming gain B=1):

$$V_{1f}[i+1] = \left(\frac{1}{V_{OUT}}\right) \times [e_1 + e_2] \quad (31)$$

where $$e = e[i] - e[i-1] \quad (32a)$$

$$e_2 = e'[i+1] - 2e'[i] + e'[i-1] \quad (32b)$$

$V_{16}$ equals (assuming gain B=1):

$$V_{16}[i] = \frac{V_{IN}[i-1]}{V_{OUT}} \times V_{1e}[i] \qquad (33a)$$

$$= \frac{V_{IN}[i-1]}{V_{OUT}} \times (V_{IN}[i-1] + e_1) \qquad (33b)$$

$V_{17}$ equals (assuming gain B=1):

$$V_{17}[i+1] = \frac{V_{IN}[i-1]}{V_{OUT}} \times (e_1 + e_2) \qquad (34)$$

The digital differentiator formed by delay stage 78 and subtractor 80 has a zero at DC, and therefore sequence $V_{1f}$ substantially has no DC component. As a result, sequence $V_{17}$ is substantially free of any DC offset introduced by delay stages 82 and 104, and ΔΣ stage 76.

Subtractor 90 provides an output $V_{18}$ that equals the difference between $V_{16}$ and $V_{17}$:

$$V_{18}[i+1] = V_{16}[i] - V_{17}[i+1] \qquad (35a)$$

$$= \frac{V_{IN}[i-1]^2}{V_{OUT}} - \frac{V_{IN}}{V_{OUT}} \times e_2 \qquad (35b)$$

Thus, $V_{18}$ is proportional to $V_{IN}$ squared divided by $V_{OUT}$, substantially without the quantization noise of Δ-Σ stage 72. Output $V_{19}$ of lowpass filter 54 approximately equals:

$$V_{19} \approx \sqrt{V_{IN}^2} \qquad (36)$$

and output $V_{OUT}$ of gain stage 36 approximately equals (assuming gain A=1):

$$V_{OUT} \approx \sqrt{V_{IN}^2} \qquad (37)$$

The circuit of FIG. 4A may be implemented using single-ended or differential circuitry.

During operation, output signals from reconfigurable ΔΣ stage 72 may pass through monitor circuit 73 to MDAC 87. As mentioned above, when $V_{OUT}$ changes polarity, ΔΣ stages 72 and 76 become unstable, producing a string of output signals with a constant logic level. Monitor circuit 73 detects this output string, which it interprets as a "fault condition" and generates a control signal that causes circuit 330 to switch from RMS-to-DC conversion mode to fault recovery mode.

In fault recovery mode, switch 75 is opened, breaking the feedback path from output $V_{OUT}$ to ΔΣ stage 72. Additionally, some components within ΔΣ stage 72 are reconfigured so that ΔΣ stage 72 functions as a comparator circuit rather than as a modulator circuit (shown as comparator circuit 77 in FIG. 4B).

Figure 4B:
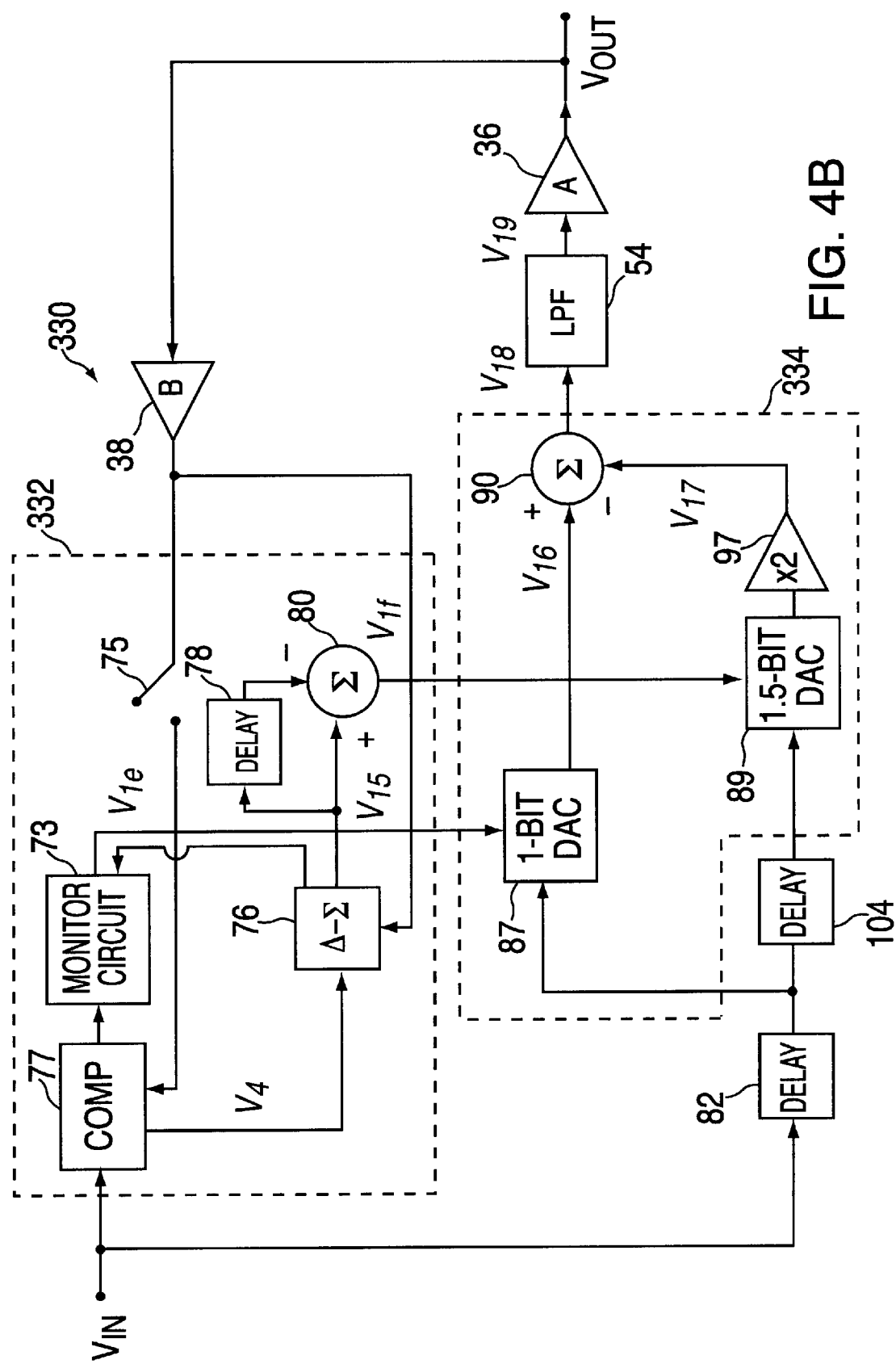
FIG. 4B is another schematic diagram of an RMS-to-DC converter circuit of the present invention.

In this arrangement, shown in FIG. 4B, circuit 330 operates as a mean-absolute-detect circuit instead of an RMS-to-DC converter. Circuit 330 thus determines the average of the absolute value of the input signal. Although this measurement is less meaningful than the RMS value of the input signal, it ensures circuit 330 will produce an output signal $V_{OUT}$ that has the proper polarity. Once $V_{OUT}$ returns to the proper polarity, the bit stream produced by comparator 77 toggles, indicating that the fault condition has cleared. Monitor circuit 73 detects this change of logic level and returns circuit 330 back to RMS-to-DC conversion mode (i.e., closes switch 75 and reconfigures comparator 77 to operate as ΔΣ stage 72). In this way, circuit 330 may detect and recover from fault conditions irrespective of the type and amplitude of input signal $V_{IN}$.

As shown in FIG. 4B, to operate as a mean-absolute-detect circuit, the feedback from $V_{OUT}$ to comparator 77 is disconnected. The output signal produced by comparator 77 is a bit stream that represents the polarity of input signal $V_{IN}$. Comparator 77 may be configured as a polarity detector using any suitable method known in the art (e.g., by connecting a threshold terminal to ground and a sensing terminal (both not shown) to input signal $V_{IN}$).

When the output of comparator 77 is provided to demodulator 334 (i.e., MDAC 87), input signal $V_{IN}$ is multiplied by its own polarity, thus performing an absolute value operation. The resulting signal is fed through lowpass filter 54 which generates an output signal ($V_{OUT}$) of the desired polarity (assuming any external stimuli has been removed from the output node).

As long as output signal $V_{OUT}$ is the incorrect polarity, ΔΣ stage 76 will remain unstable. Its output will therefore remain at either a logic low or a logic high (depending on its state when the output fault occurred). In this case, subtractor 80 will have a substantially zero output and will not affect the value of V$hd$ OUT.

When circuit 330 is operating as a mean-absolute-detect circuit, error signal $V_4$ produced by comparator 77 is the input signal $V_{IN}$ (or a scaled version thereof). Thus, the output of ΔΣ stage 76 can be monitored (by monitor circuit 73) to determine when recovery from an output fault has occurred. For example, when the bit stream produced by ΔΣ stage 76 toggles from one logic state to another, indicating the output has changed polarity, circuit 330 has recovered from the fault condition and may be reconfigured back to the RMS-to-DC converter shown in FIG. 4A.

The overall gain of circuit 330 during fault recovery (i.e., mean-absolute-detect mode) does not need to be similar to that of the RMS-to-DC mode (normal operation). However, increased gain during fault recovery does tend to reduce recovery time. Moreover, it will be understood that with certain input waveforms and filter time constants, circuit 330 may go into fault recovery, back to normal operation, and back to fault recovery several times in succession. As long as the output is free of external influences however, circuit 330 will recover. The successive fault mode periods will become shorter in duration until circuit 330 has fully recovered.

As mentioned above, monitoring circuit 73 may detect an output fault by detecting a string of same logic level output bits from reconfigurable ΔΣ stage 72. This will occur anytime reconfigurable ΔΣ stage 72 is overloaded, either because it is unstable or because the input signal $V_{IN}$ is excessively large. Thus, under certain circumstances a fault condition may be detected even when the output signal $V_{OUT}$ is the "correct" polarity.

One such case is when the amplitude of the input signal ($V_{IN}$) increases suddenly. For example, a step change of about a factor of ten may cause reconfigurable ΔΣ stage 72 to overload and produce an output duty cycle of either 0% or 100% at the peaks of the input waveform. This result is acceptable and even desirable because it tends to decrease the output response time.

Another case during which a fault condition may be detected is when input signal $V_{IN}$ has a large peak value with respect to the DC level of the output signal $V_{OUT}$ (e.g., this may occur with input signals $V_{IN}$ having a high crest factor). Such an input signal may, during its peak, cause reconfigurable ΔS stage 72 to produce an output having a duty cycle of either 0% or 100%. Depending on the duration of the peak and the length of the output string detected by monitor circuit 73, this may initiate entry into the fault recovery mode of operation. This will increase the magnitude of the output signal $V_{OUT}$ during a time when it otherwise would be underestimated.

Figure 5:
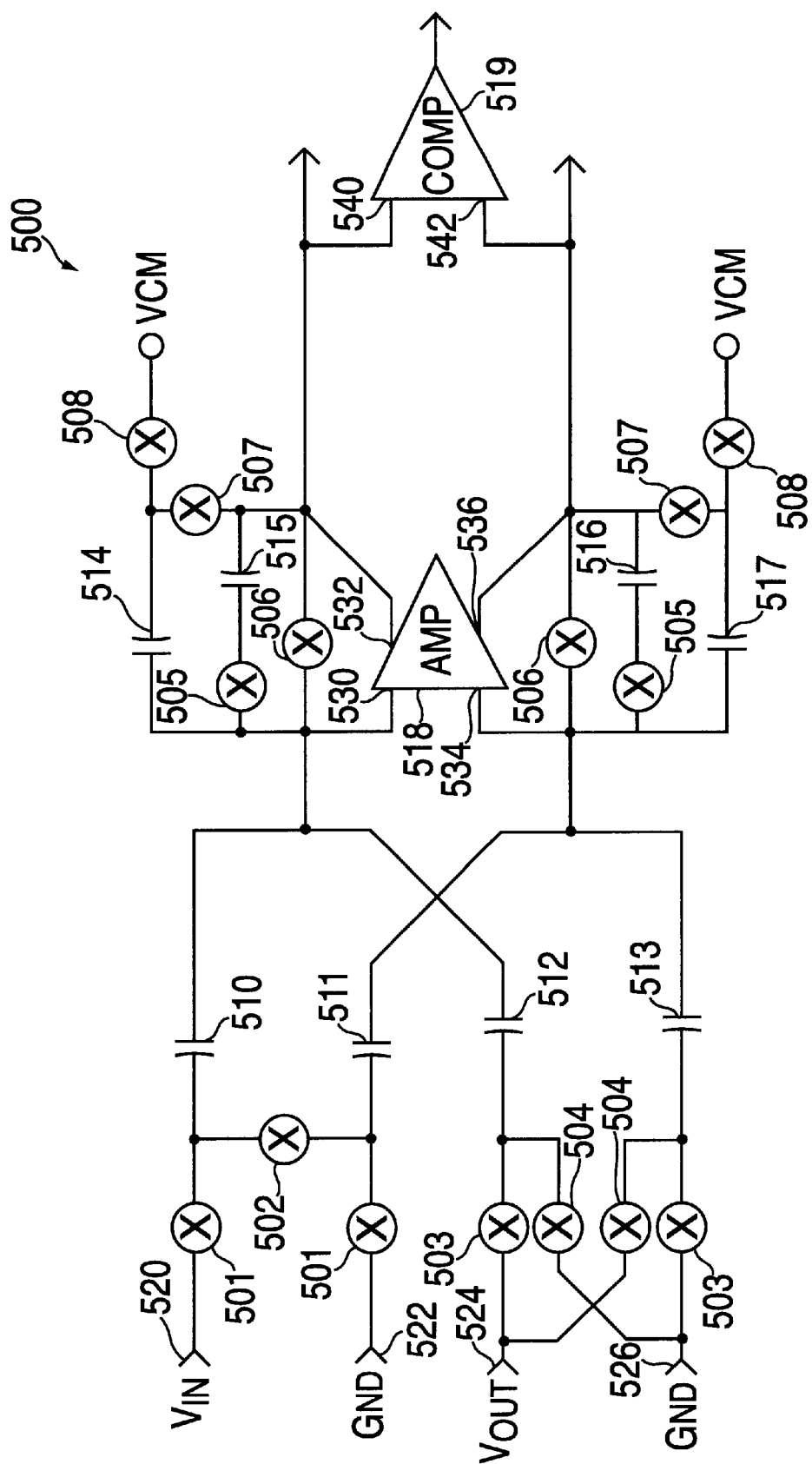
FIG. 5 is a schematic diagram of the reconfigurable $\Delta\Sigma$ modulator of FIGS. 2–4.

FIG. 5 is a schematic diagram of one possible embodiment of reconfigurable ΔΣ stage 72. In FIG. 5, reconfigurable ΔΣ stage 72, shown as system 500, includes switches 501–508, capacitors 510–517, amplifier 518, and comparator 519. As mentioned above, system 500 may be configured to operate as either ΔΣ modulator 72 or as comparator 77, depending on the state (i.e., open or closed) of switches 501–508.

When configured as ΔΣ stage 72, system 500 progresses through essentially two phases of operation, an auto-zero phase and integration phase. In auto-zero phase, switches 501, 506, and 508 are closed. In addition, either switches 503 or 504 are closed depending on the output of comparator 519. For example, if the output of comparator 519 is a logic high, switches 504 may be closed and switches 503 may be open. Alternatively, if the output of comparator 519 is a logic low, switches 504 may be open and switches 503 may be closed.

Input voltage $V_{IN}$ is applied to node 520 and node 522 is connected to ground (if desired, node 522 may be used as a differential input). In the arrangement shown, capacitor 510 is charged to the value of input voltage $V_{IN}$, and capacitor 511 is set to ground. Assuming for the sake of illustration, that switches 503 are closed and switches 504 are open, capacitor 512 is charged to the value of $V_{OUT}$ and capacitor 513 is set to ground.

Closing switches 506 provides a feedback path from outputs 532 and 536 of amplifier 518 to inputs 530 and 534, respectively. This sets the gain of amplifier 518, which is preferably a differential transconductance amplifier, to unity. At this point, system 500 has acquired the values of both the input and output voltages and is ready to proceed to the integration phase of operation.

In the integration phase, switches 501 and 506 are opened and switches 502 and 505 are closed, configuring amplifier 518 as an integrator. Furthermore, the state of switches 503 or 504 are interchanged. That is, if switches 503 were closed and switches 504 were open during auto-zero, switches 503 open and switches 504 close during integration (and vice versa). This transfers the charge from capacitors 510–513 to capacitors 515 and 516, respectively. Thus, the resulting charge on capacitors 515 and 516 is now equal to the transferred charge plus any charge from the previous integration phase. Amplifier 518 generates a differential output at terminals 532 and 536 which is a function of the result of the previous integration phase, the value of $V_{IN}$ and $V_{OUT}$, and the output state of comparator 519. Comparator 519, which is preferably a latching comparator, compares these values and generates an output signal based on the comparison.

When configured as comparator stage 77, system 500 also operates in essentially two phases of operation, an auto-zero phase and a sample and hold phase. In auto-zero phase, switches 501, 506, and 508 are closed. In addition, either switches 503 or 504 are closed.

Input voltage $V_{IN}$ is applied to node 520 and node 522 is connected to ground. In this arrangement, capacitor 510 is charged to the value of input voltage $V_{IN}$, and capacitor 511 is set to ground. Closing switches 506 provides a feedback path from outputs 532 and 536 of amplifier 518 to inputs 530 and 534, respectively. This sets the gain of amplifier 518 to unity. At this point, system 500 has acquired the values of both the input and output voltages and is ready to proceed to the sample and hold phase of operation.

In the sample and hold phase, switches 501 and 506 are opened and switches 502 and 507 are closed, configuring amplifier 518 as a buffer. In this mode the state of switches 503 or 504 are preferably not interchanged. The charge from capacitors 510 and 511 (but not 512 and 513) is transferred to capacitors 514 and 517, respectively. Thus, the resulting charge on capacitors 514 and 517 is now substantially equal to the input voltage $V_{IN}$. Amplifier 518 generates a differential output at terminals 532 and 536 based on $V_{IN}$, which is provided to input terminals 540 and 542 of comparator 519. Comparator 519 compares these values and generates an output signal based on the comparison.

Persons skilled in the art will recognize that the apparatus of the present invention may be implemented using circuit configurations other than those shown and discussed above. All such modifications are within the scope of the present invention, which is limited only by the claims that follow.

What is claimed is:

1. In a circuit that generates an output signal at an output node proportional to a root-mean-square (RMS) value of an input signal, a method for detecting and recovering from an output fault condition, the method comprising:

monitoring the circuit for an occurrence of an output fault; and generating a modified output signal based on the input signal when the output fault condition is detected so that said modified output signal, when present at the output node, causes the circuit to recover from the fault condition.

2. The method of claim 1 wherein said generating further comprises providing said modified output signal at a predetermined polarity.

3. The method of claim 1 wherein said generating further comprises performing an absolute value operation on the input signal.

4. The method of claim 1 further comprising monitoring the circuit to determine when the circuit recovers from the output fault condition.

5. The method of claim 1 wherein said generating further comprises:

reconfiguring at least a portion of the circuit to create said modified output signal; and providing at least a portion of a signal present at the output node back to the circuit as a feedback signal.

6. The method of claim 5 wherein said reconfiguring includes configuring at least a portion of the circuit to function as an absolute value detect circuit.

7. The method of claim 6 wherein said generating further comprises:

providing the input signal to said absolute value detect circuit; and performing an absolute value operation on the input signal.

8. The method of claim 7 further comprising providing said absolute value of said input signal to the output node.

9. The method of claim 8 wherein said circuit includes a pulse modulator circuit further comprising monitoring a signal present at the output node to determine when the circuit recovers from the output fault condition.

10. In a circuit that generates a direct current (DC) output signal at an output node proportional to a root-mean-square (RMS) value of an input signal, a method for detecting and recovering from an output fault condition, the method comprising:

providing an analog input signal to the circuit;

providing at least a portion of the DC output signal back to the circuit as a feedback signal;

generating a first pulse code modulated representation of said analog input signal and said DC output signal with a reconfigurable circuit;

monitoring said first pulse code modulated signal for an occurrence of an output fault with a monitor circuit; and generating a modified output signal based on the input signal when the output fault condition is detected so that said modified output signal, when present at the output node, causes the circuit to recover from the fault condition.

11. The method of claim 10 further comprising generating a second pulse code modulated representation of said analog input signal and said output signal with a pulse modulator circuit.

12. The method of claim 10 wherein said generating said modified output signal further comprises performing an absolute value operation on the input signal.

13. The method of claim 11 further comprising monitoring said second pulse code modulated representation of said input signal and said output signal to determine when the circuit recovers from the output fault condition.

14. The method of claim 10 wherein said generating said modified output signal further comprises changing the configuration of said reconfigurable circuit to function as a comparator circuit when the output fault condition is detected.

15. The method of claim 10 further comprising:

generating a second pulse code modulated representation of said analog input signal and said output signal with a pulse with modulator circuit;

reconfiguring said reconfigurable circuit to function as a comparator circuit when the output fault condition is detected, said comparator circuit producing an output indicative of the polarity of the input signal;

monitoring said second pulse code modulated representation of said input signal and said output signal to determine when the circuit recovers from the output fault condition; and reconfiguring said reconfigurable circuit to function as a pulse code modulator circuit when said monitor circuit determines that the circuit has recovered from the output fault condition so that the circuit produces the (DC) output signal proportional to the root-mean-square (RMS) value of the input signal.

* * * * *

UNITED STATES PATENT AND TRADEMARK OFFICE
CERTIFICATE OF CORRECTION

PATENT NO. : 6,516,291 B2
DATED : February 4, 2003
INVENTOR(S) : Petrofsky

It is certified that error appears in the above-identified patent and that said Letters Patent is hereby corrected as shown below:

Title page,
Item [56], References Cited, OTHER PUBLICATIONS,
"Toumazou, C., et al.," reference, change "ed.s," to -- eds. --;

Column 2,
Line 36, change "$V_{IN}$-$V_{OUT}$" to -- $V_{IN}$=-$V_{OUT}$ --; and Column 10,
Line 57, change "provide" to -- provides --.

Signed and Sealed this

Fourth Day of January, 2005

JON W. DUDAS
*Director of the United States Patent and Trademark Office*